United States Patent
Kobayashi et al.

[11] Patent Number: 6,111,688
[45] Date of Patent: Aug. 29, 2000

[54] OPTICAL AMPLIFIER AND SYSTEM INCLUDING THE SAME

[75] Inventors: Taiki Kobayashi; Yoshihito Onoda; Tadashi Okiyama, all of Kawasaki, Japan

[73] Assignee: Fujitsu Limited, Kawasaki, Japan

[21] Appl. No.: 09/198,566

[22] Filed: Nov. 23, 1998

[30] Foreign Application Priority Data

Mar. 17, 1998 [JP] Japan .................................. 10-067247

[51] Int. Cl.⁷ ...................................................... H01S 3/00
[52] U.S. Cl. ........................................... 359/341; 359/345
[58] Field of Search .................................... 359/341, 345, 359/124

[56] References Cited

U.S. PATENT DOCUMENTS

| | | | |
|---|---|---|---|
| 4,906,949 | 3/1990 | Pocholle et al. | 330/4.3 |
| 5,245,690 | 9/1993 | Aida et al. | 385/142 |
| 5,363,385 | 11/1994 | Heidemann | 372/6 |
| 5,541,766 | 7/1996 | Mizrahi et al. | 359/337 |
| 5,835,259 | 11/1998 | Kakui et al. | 359/341 |
| 6,049,414 | 4/2000 | Espindola et al. | 359/337 |

FOREIGN PATENT DOCUMENTS

| | | |
|---|---|---|
| 859 435 A2 | 8/1998 | European Pat. Off. . |
| 5-7036 | 1/1993 | Japan . |
| 9-97940 | 4/1997 | Japan . |

OTHER PUBLICATIONS

Y. Sugaya, et al., "Novel Configuration for Low–Noise and Wide–Dynamic–Range Er–Doped Fiber Amplifier for WDM Systems", pp. 158–161.

S. Kinoshita, et al., "Low–Noise & Wide–Dynamic–Range Erbium–Doped Fiber Amplifiers with Automatic Level Control for WDM Transmission Systems", pp. 211–214.

*Primary Examiner*—Mark Hellner
*Attorney, Agent, or Firm*—Staas & Halsey

[57] ABSTRACT

Disclosed herein is an optical amplifier including an optical amplifying medium, a pumping source, an optical filter, and a control unit. Signal light is supplied to the optical amplifying medium. The pumping source supplies pump light to the optical amplifying medium so that the optical amplifying medium provides a gain band including the wavelength of the signal light. The optical filter is optically connected between the optical amplifying medium and the pumping source, and has wavelength selectivity depending upon temperature. The control unit controls the temperature of the optical filter according to a control signal given to the control unit. The wavelength characteristic of gain in the gain band provided by the optical amplifying medium changes according to the power of the signal light and the power and center wavelength of the pump light. When the temperature of the optical filter changes, the wavelength selectivity of the optical filter changes, so that the center wavelength of the pump light changes. Accordingly, the gain tilt of the optical amplifier can be adjusted.

24 Claims, 9 Drawing Sheets

OPTICAL AMPLIFIER AND SYSTEM INCLUDING THE SAME

BACKGROUND OF THE INVENTION

1. Field of the Invention

The present invention relates to an optical amplifier suitable for wavelength division multiplexing (WDM) and also to a system including the optical amplifier.

2. Description of the Related Art

In recent years, a manufacturing technique and using technique for a low-loss (e.g., 0.2 dB/km) optical fiber have been established, and an optical communication system using the optical fiber as a transmission line has been put to practical use. Further, to compensate for losses in the optical fiber and thereby allow long-haul transmission, the use of an optical amplifier for amplifying signal light has been proposed or put to practical use.

An optical amplifier known in the art includes an optical amplifying medium to which signal light to be amplified is supplied and means for pumping the optical amplifying medium so that the optical amplifying medium provides a gain band including the wavelength of the signal light. For example, an erbium doped fiber amplifier (EDFA) includes an erbium doped fiber (EDF) as the optical amplifying medium and a pumping source for supplying pump light having a predetermined wavelength to the EDF. By preliminarily setting the wavelength of the pump light within a 0.98 $\mu$m band or a 1.48 $\mu$m band, a gain band including a wavelength of 1.55 $\mu$m can be obtained. Further, another type optical amplifier having a semiconductor chip as the optical amplifying medium is also known. In this case, the pumping is performed by injecting an electric current into the semiconductor chip.

As a technique for increasing a transmission capacity by a single optical fiber, wavelength division multiplexing (WDM) is known. In a system adopting WDM, a plurality of optical carriers having different wavelengths are used. The plural optical carriers are individually modulated to thereby obtain a plurality of optical signals, which are wavelength division multiplexed by an optical multiplexer to obtain WDM signal light, which is output to an optical fiber transmission line. At the receiving end, the WDM signal light received is separated into individual optical signals by an optical demultiplexer, and transmitted data is reproduced according to each optical signal. Accordingly, by applying WDM, the transmission capacity in a single optical fiber can be increased according to the number of WDM channels.

In the case of incorporating an optical amplifier into a system adopting WDM, a transmission distance is limited by the wavelength characteristic of gain which characteristic is often called a gain tilt. For example, in the case that a plurality of optical amplifiers are cascaded, the gain tilt generated in each optical amplifier is accumulated to cause a degradation in signal-to-noise ratio for a low-level channel or a degradation in waveform due to nonlinear effects or the like for a high-level channel. As a result, a transmission distance for obtaining a required receiving sensitivity is limited. Accordingly, in this kind of system, it is greatly effective to make the gain tilt adjustable in each optical amplifier in increasing the transmission distance.

SUMMARY OF THE INVENTION

It is therefore an object of the present invention to provide an optical amplifier which can adjust a gain tilt.

It is another object of the present invention to provide an optical amplifier which can maintain a gain tilt constant or flat.

It is a further object of the present invention to provide a novel system including such an optical amplifier.

In accordance with an aspect of the present invention, there is provided an optical amplifier including an optical amplifying medium, a pumping source, an optical filter, and a control unit. Signal light is supplied to the optical amplifying medium. The pumping source supplies pump light to the optical amplifying medium so that the optical amplifying medium provides a gain band including the wavelength of the signal light. The optical filter is optically connected between the optical amplifying medium and the pumping source, and has wavelength selectivity depending upon temperature. The control unit controls the temperature of the optical filter according to a control signal given to the control unit.

The wavelength characteristic of gain in the gain band provided by the optical amplifying medium changes according to the power of the signal light and the power and center wavelength of the pump light.

In the present invention, the wavelength selectivity of the optical filter changes with a change in temperature of the optical filter, resulting in a change in center wavelength of the pump light. Accordingly, the gain tilt of the optical amplifier can be adjusted, thus achieving one of the objects of the present invention.

Preferably, a gain given to an optical signal having a certain wavelength by the optical amplifying medium or a gain given to a plurality of optical signals included in a certain band is detected, and the control signal is generated so that the detected gain is maintained constant, thereby maintaining the gain tilt of the optical amplifier constant or flat.

Preferably, a gain tilt generated in the optical amplifying medium is detected, and the control signal is generated so that the detected gain tilt becomes constant or flat.

In accordance with another object of the present invention, there is provided a system comprising an optical fiber transmission line and an optical amplifier optically connected to the optical fiber transmission line. The optical fiber transmission line transmits WDM (wavelength division multiplexed) signal light obtained by wavelength division multiplexing a plurality of optical signals having different wavelengths. The optical amplifier is provided by the optical amplifier according to the present invention.

For example, in the case that the optical amplifier is provided by each of a plurality of optical repeaters arranged along the optical fiber transmission line, the gain tilt generated in each optical amplifier is accumulated to limit a transmission distance. Accordingly, the configuration of the system according to the present invention is greatly effective in avoiding such a limitation of the transmission distance.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described in detail with reference to the attached drawings.

Figure 1:
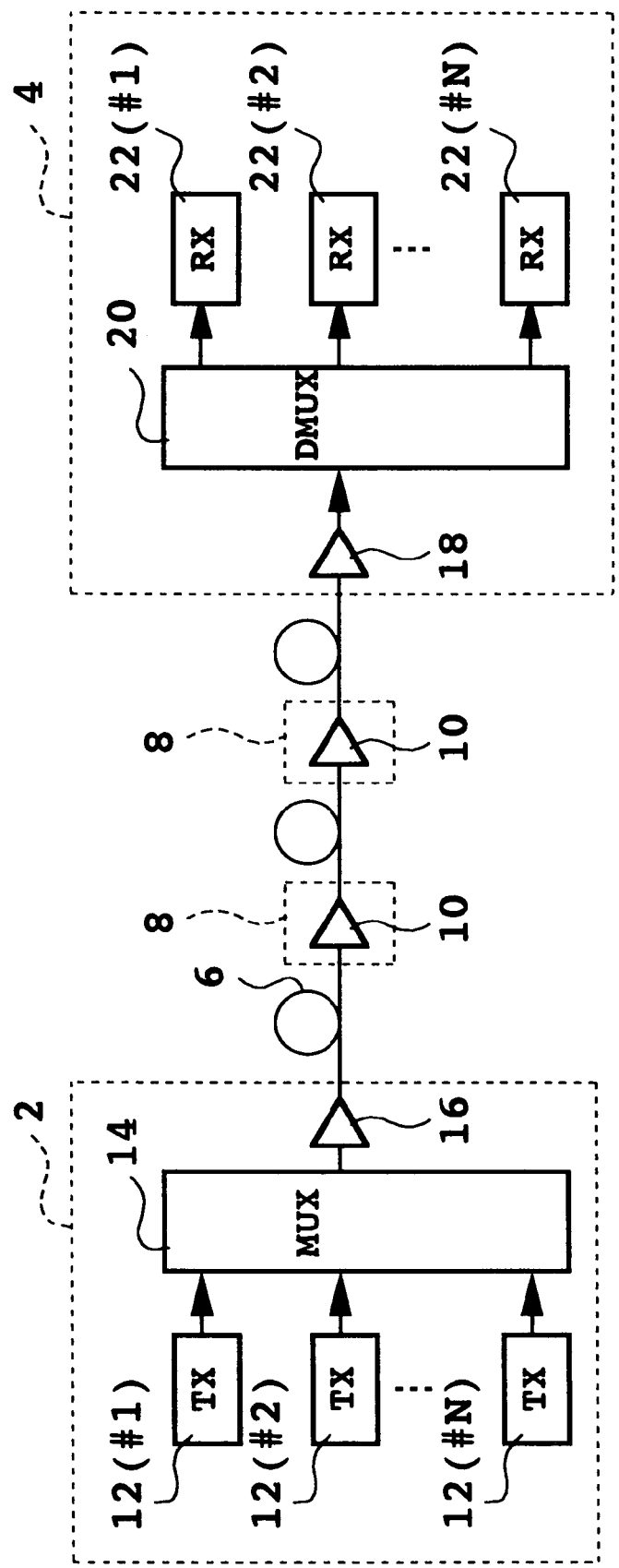
FIG. 1 is a block diagram showing a preferred embodiment of the system according to the present invention.

FIG. 1 is a block diagram showing a preferred embodiment of the optical fiber communication system according to the present invention. This system includes a first terminal station 2, a second terminal station 4, an optical fiber transmission line 6 connecting the terminal stations 2 and 4, and a plurality of (two in this preferred embodiment) optical repeaters 8 arranged along the optical fiber transmission line 6. Each optical repeater 8 includes an optical amplifier 10 optically connected to the optical fiber transmission line 6. A single optical repeater 8 may be used instead.

The first terminal station 2 includes a plurality of optical transmitters (TX) 12 (#1 to #N) for respectively outputting a plurality of optical signals having different wavelengths, an optical multiplexer (MUX) 14 for wavelength division multiplexing the optical signals output from the optical transmitters 12 (#1 to #N) to obtain WDM signal light, and an optical amplifier (postamplifier) 16 for amplifying the WDM signal light obtained from the optical multiplexer 14 to output resultant amplified WDM signal light to the optical fiber transmission line 6.

The second terminal station 4 includes an optical amplifier (preamplifier) 18 for amplifying the WDM signal light from the optical fiber transmission line 6, an optical demultiplexer (DMUX) 20 for separating resultant amplified WDM signal light output from the optical amplifier 18 into a plurality of optical signals, and a plurality of optical receivers (RX) 22 (#1 to #N) for respectively receiving the optical signals from the optical demultiplexer 20.

With this system configuration, loss of the WDM signal light can be compensated by the optical repeater or repeaters 8 arranged along the optical fiber transmission line 6, thereby allowing long-haul transmission. Furthermore, the optical signals of plural channels are transmitted by the optical fiber transmission line 6 of one channel, thereby increasing a transmission capacity.

Figure 2:
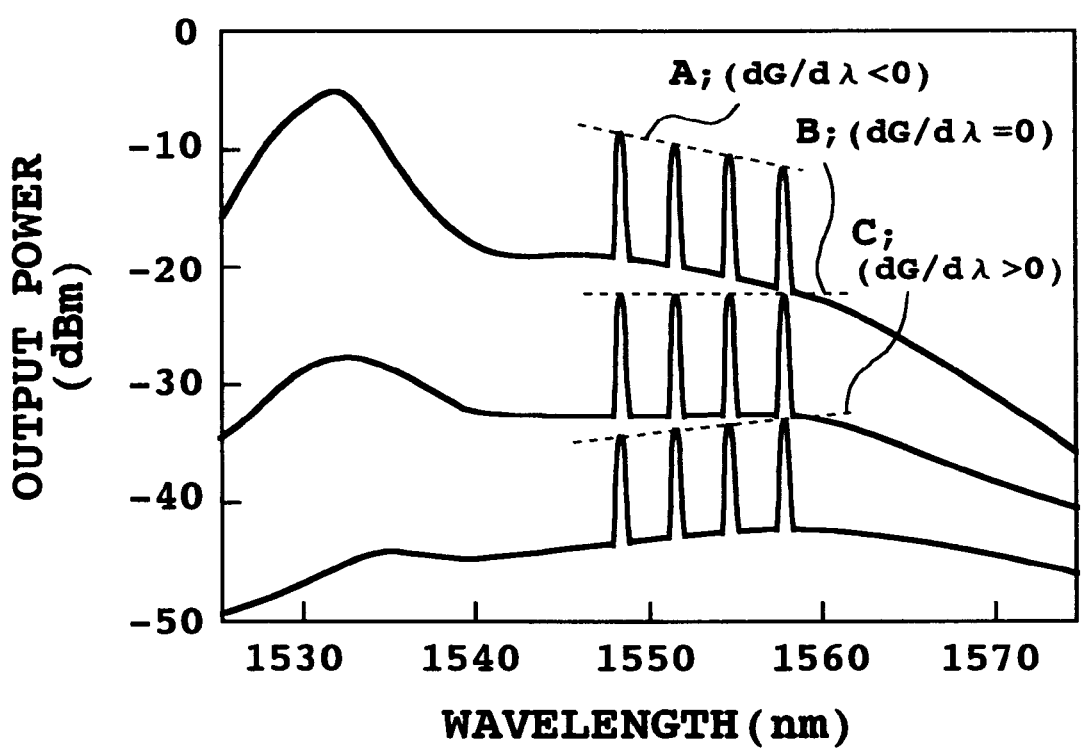
FIG. 2 is a graph for illustrating a gain tilt occurring in an optical amplifier.

FIG. 2 is a graph for illustrating a gain tilt occurring in an optical amplifier. There are shown in FIG. 2 the spectra of output light when WDM signal light based on optical signals of four channels (having wavelengths of 1548, 1551, 1554, and 1557 nm) having the same power (−35 dBm/ch) is input into an EDFA (erbium doped fiber amplifier). In FIG. 2, the vertical axis represents output power (dBm), and the horizontal axis represents wavelength (nm).

The spectrum shown by A corresponds to the case where the power of pump light is relatively high, causing a negative gain tilt in a band of about 1540 to 1560 nm. That is, the negative gain tilt is a gain tilt such that the gain decreases with an increase in wavelength, and the derivative of gain (G) with respect to wavelength ($\lambda$) is negative ($dG/d\lambda < 0$).

The spectrum shown by C corresponds to the case where the power of pump light is relatively low, causing a positive gain tilt in a band of about 1540 to 1560 nm. That is, the positive gain tilt is a gain tilt such that the gain increases with an increase in wavelength, and the derivative of gain (G) with respect to wavelength ($\lambda$) is positive ($dG/d\lambda > 0$).

The spectrum shown by B corresponds to the case where the power of pump light is optimum so that no gain tilt is induced or the gain tilt becomes flat in a band of about 1540 to 1560 nm, and the derivative of gain (G) with respect to wavelength ($\lambda$) is zero ($dG/d\lambda = 0$).

Each spectrum has such a shape that four sharp spectra corresponding to the optical signals of the four channels are superimposed on a gentle spectrum of ASE (amplified spontaneous emission). It is known that the wavelength characteristic of gain for a small signal depends on an ASE spectrum.

Figure 3:
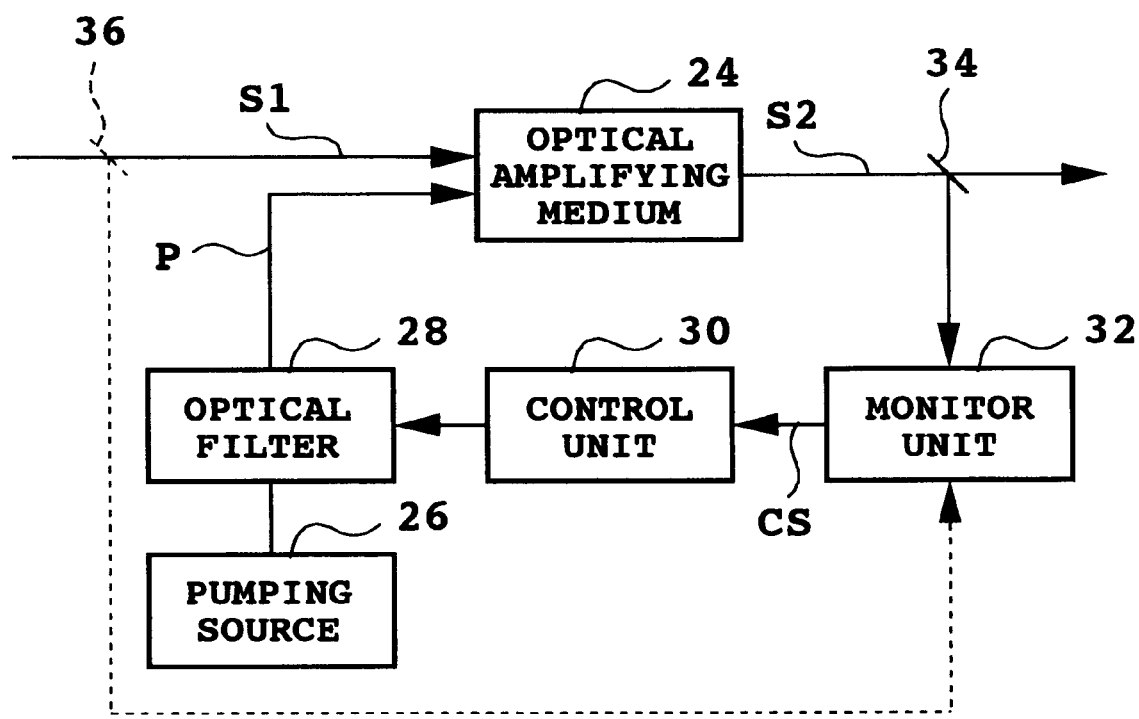
FIG. 3 is a block diagram showing a basic configuration of the optical amplifier according to the present invention.

FIG. 3 is a block diagram showing a basic configuration of the optical amplifier according to the present invention. Signal light S1 to be amplified is supplied to an optical amplifying medium 24. Pump light P is supplied from a pumping source 26 to the optical amplifying medium 24 so that the optical amplifying medium 24 provides a gain band including the wavelength of the signal light S1. The term of "gain band" used herein is defined as a band in which a gain is generated in the optical amplifying medium 24. An optical filter 28 is optically connected between the optical amplifying medium 24 and the pumping source 26. Accordingly, the pump light P output from the pumping source 26 is supplied through the optical filter 28 to the optical amplifying medium 24.

The optical filter 28 has wavelength selectivity depending upon temperature. A control unit 30 controls the temperature of the optical filter 28 according to a control signal CS supplied to the control unit 30. When the temperature of the optical filter 28 is changed by the control unit 30, the wavelength selectivity of the optical filter 28 is changed, causing a change in center wavelength of the pump light P being supplied to the optical amplifying medium 24. When the center wavelength of the pump light P being supplied to the optical amplifying medium 24 is changed, the wavelength characteristic of gain generated in the optical amplifying medium 24 is changed. Accordingly, a gain tilt that may be generated in the optical amplifying medium 24 can be adjusted according to the control signal CS.

In this configuration, the control signal CS is supplied from a monitor unit 32 to the control unit 30. The monitor unit 32 detects the gain or gain tilt generated in the optical amplifying medium 24. The monitor unit 32 can detect the gain tilt generated in the optical amplifying medium 24, according to a part of amplified signal light S2 which part is branched off by an optical branching circuit 34. Further, the monitor unit 32 can detect the gain generated in the optical amplifying medium 24, according to the power of a part of the signal light S2 which part is branched off by the optical branching circuit 34 and the power of a part of the signal light S1 which part is branched off by an optical branching circuit 36.

That is, the gain generated in the optical amplifying medium 24 is defined as a ratio or difference between a signal light input level and a signal light output level of the optical amplifying medium 24. The power of a part of the signal light S2 branched off by the optical branching circuit 34 reflects the signal light output level of the optical amplifying medium 24, and the power of a part of the signal light S1 branched off by the optical branching circuit 36 reflects the signal light input level of the optical amplifying medium 24. Thus, the monitor unit 32 can detect the gain according to these powers. Accordingly, by generating the control signal CS from the monitor unit 32 so that the gain detected by the monitor unit 32 is maintained constant, the gain tilt generated in the optical amplifying medium 24 can be made constant or flat.

Alternatively, the monitor unit 32 may generate the control signal CS directly so that the gain tilt detected becomes constant or flat. The principle of detection of the gain tilt will be hereinafter described.

The optical amplifier according to the present invention may be used as each of the optical amplifiers 10, 16, and 18 shown in FIG. 1. In this case, a gain deviation between optical signals of plural channels can be reduced to thereby more increase a transmission distance.

A doped fiber doped with a rare earth element such as Er (erbium), Nd (neodymium), and Yb (ytterbium) may be used as the optical amplifying medium 24. In this case, forward pumping may be performed in such a manner that both the signal light S1 and the pump light P propagate in the doped fiber from its first end toward its second end, or backward pumping may be performed in such a manner that the signal light S1 and the pump light P are supplied to the first end and the second end of the doped fiber, respectively. Alternatively, bidirectional pumping may be performed in such a manner that first pump light and second pump light are supplied to the first end and the second end of the doped fiber, respectively.

A fiber grating having a narrow reflection band including a resonance wavelength as the center wavelength may be used as the optical filter 28.

In the case that the refractive index of an optical medium (e.g., glass) is permanently changed by irradiation of light, this medium is referred to as being photosensitive. By using this property, a fiber grating can be formed in the core of an optical fiber. The feature of a fiber grating is to perform Bragg reflection of light in a narrow band near a resonance wavelength determined by its grating pitch and the effective refractive index of a fiber mode. A fiber grating can be formed by irradiating an optical fiber with light from an excimer laser oscillating at a wavelength of 248 nm or 193 nm by use of a phase mask, for example.

In the case of using a fiber grating as the optical filter 28, the resonance wavelength of the fiber grating can be changed because the grating pitch for example can be easily changed according to the temperature of the fiber grating, thereby allowing easy adjustment of the wavelength selectivity of the optical filter 28. Accordingly, in the present invention wherein the wavelength selectivity is adjusted according to the temperature of the optical filter 28, the use of the fiber grating as the optical filter 28 is greatly effective in realizing high-sensitive control. Furthermore, because the heat capacity of a fiber grating is small, the use of the fiber grating as the optical filter 28 makes it possible to realize good-response control.

Figure 4:
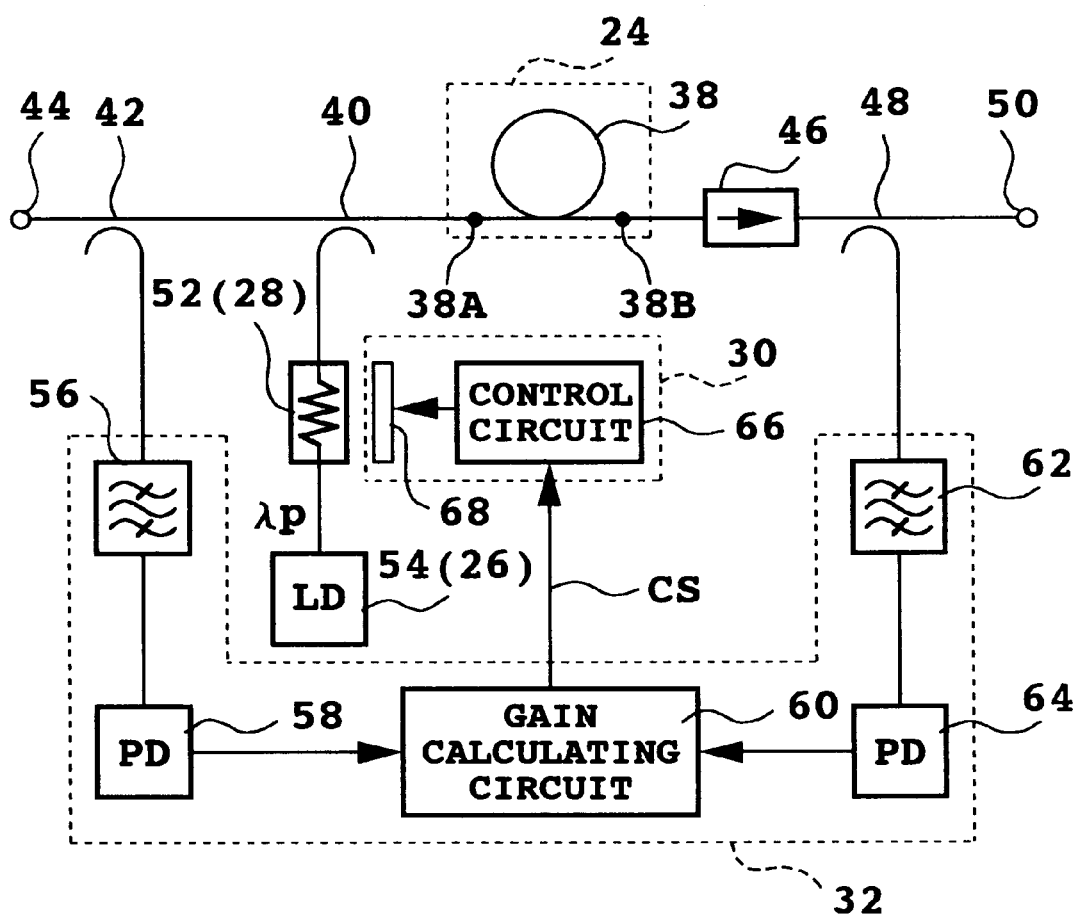
FIG. 4 is a block diagram showing a first preferred embodiment of the optical amplifier according to the present invention.

FIG. 4 is a block diagram showing a first preferred embodiment of the optical amplifier according to the present invention. In this preferred embodiment, an erbium doped fiber (EDF) 38 is adopted as the optical amplifying medium 24 to obtain a gain band including a 1.55 $\mu$m band (e.g., 1.53 to 1.57 $\mu$m) in which a lowest loss is obtained in a silica fiber. The EDF 38 has a first end 38A and a second end 38B. The first end 38A of the EDF 38 is optically connected through a WDM coupler 40 and an optical coupler 42 to an input port 44, and the second end 38B of the EDF 38 is optically connected through an optical isolator 46 and an optical coupler 48 to an output port 50. The optical couplers 42 and 48 are used to respectively detect the input level and the output level of this optical amplifier, so that each of the optical couplers 42 and 48 can be fabricated without especially considering the wavelength dependence of branching ratio. The WDM coupler 40 is used to supply pump light having a wavelength different from the wavelength of signal light to be amplified, from the first end 38A into the EDF 38, so that the WDM coupler 40 is fabricated in consideration of the wavelength dependence of branching ratio.

A fiber grating 52 and a laser diode (LD) 54 are provided as the optical filter 28 and the pumping source 26, respectively. One end of the fiber grating 52 is optically connected to the WDM coupler 40, and the other end of the fiber grating 52 is optically connected to the laser diode 54.

The laser diode 54 oscillates in a pump band (whose center wavelength is $\lambda$p) determined so that a gain band obtained in the EDF 38 includes 1.55 $\mu$m. The pump band is selected from a 0.98 $\mu$m band and a 1.48 $\mu$m band, for example. The 0.98 $\mu$m band is defined as a range of 0.96 to 1.0 $\mu$m, for example, and the 1.48 $\mu$m band is defined as a range of 1.46 to 1.50 $\mu$m.

The light branched off by the optical coupler 42 and having a power reflecting the input level of the optical amplifier is supplied through an optical bandpass filter 56 to a photodetector (PD) 58. The photodetector 58 outputs an electrical signal having a voltage level (or current level) corresponding to the power of the light received, and supplies the electrical signal to a gain calculating circuit 60. On the other hand, the light branched off by the optical coupler 48 and having a power reflecting the output level of the optical amplifier is supplied through an optical bandpass filter 62 to a photodetector 64. The photodetector 64 outputs an electrical signal having a voltage level (or current level) corresponding to the power of the light received, and supplies the electrical signal to the gain calculating circuit 60. The gain calculating circuit 60 calculates a gain according to the two electrical signals received, and generate a control signal CS so that the gain is maintained constant.

Each of the optical bandpass filters 56 and 62 has a pass band including the wavelength of an optical signal of one channel or a pass band including the wavelengths of optical signals of plural channels. In each case, the pass band is set as a relatively narrow band included in the gain band, thereby reducing a detection error due to ASE. The pass bands of the filters 56 and 62 are set identical with each other.

The control unit 30 includes a control circuit 66 receiving the control signal CS, and a temperature regulator 68 provided in touch with or in the vicinity of the fiber grating 52. A Peltier element capable of controlling absorption and radiation of heat according to a drive current supplied thereto may be used as the temperature regulator 68. The control circuit 66 feedback-controls the drive current for the temperature regulator 68 according to the control signal CS received, thereby maintaining the gain constant.

A gain tilt generated in the EDF 38 reflects the gain detected, so that the gain tilt can be maintained constant or flat by performing feedback control such that the gain detected becomes constant.

When signal light (WDM signal light) to be amplified is supplied from the input port 44 into the EDF 38 being pumped by the laser diode 54, the signal light is amplified in the EDF 38 in accordance with the principle of stimulated emission. The signal light amplified is passed through the optical isolator 46 and output from the output port 50. The reason why the optical isolator 46 is used is to eliminate a possibility that an optical resonator structure including the EDF 38 may be formed to cause instability of amplification.

Figure 5:
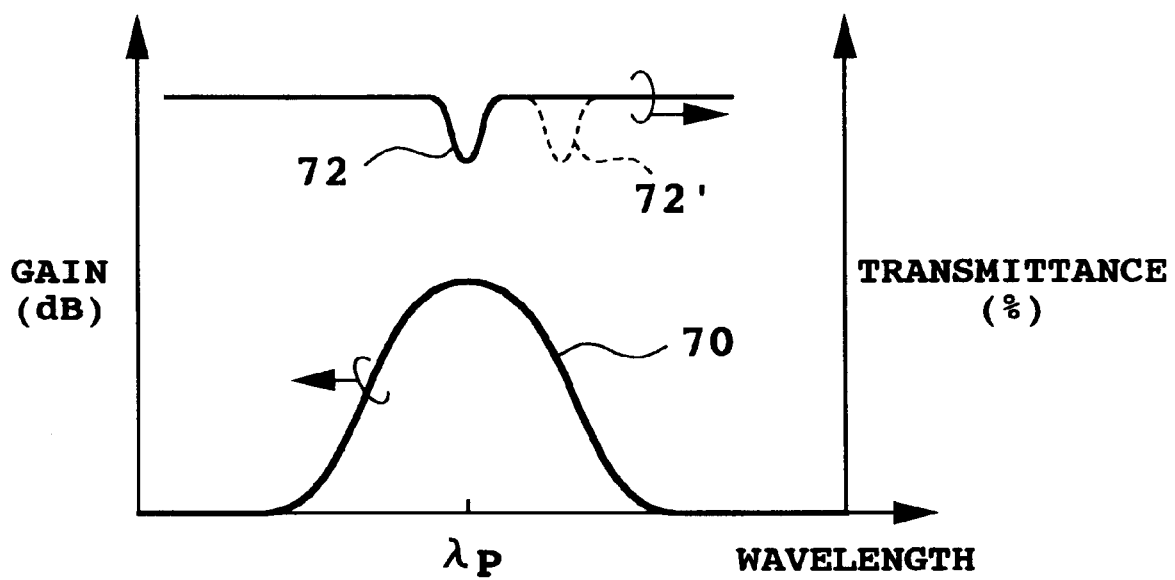
FIG. 5 is a graph for illustrating the principle of operation of the optical amplifier shown in FIG. 4.

The way of controlling the gain tilt in the optical amplifier shown in FIG. 4 will now be described with reference to FIG. 5. In FIG. 5, the vertical axes represent gain (dB) generated in the EDF 38 and transmittance (%) of the fiber grating 52, and the horizontal axis represents wavelength. The curve denoted by reference numeral 70 shows a relation between gain and pump light wavelength in the case that the pump light power is constant. As shown by the curve 70, a maximum gain is obtained when the pump light wavelength is coincident with the center wavelength $\lambda p$ in the pump band, and the gain decreases as the pump light wavelength is shifted away from the center wavelength $\lambda p$ in the pump band.

A conventional method for adjusting a gain tilt is to change the power of pump light under a constant pump light wavelength. For example, the gain tilt is changed with a change in pump light power as shown in FIG. 2.

The present invention adopts the fact that a gain changes with a change in pump light wavelength, thereby adjusting a gain tilt. In other words, because the gain tilt and the gain are substantially in a 1:1 correspondence, the gain is changed by changing a pump light wavelength, thereby adjusting the gain tilt.

It is now assumed that the reflection band of the fiber grating 52 is provided as shown by reference numeral 72 so that its center wavelength is coincident with $\lambda p$. In this case, the spectrum of pump light output from the laser diode 54 is narrowed and its center wavelength is locked to the center wavelength in the reflection band 72. As a result, the gain tilt becomes negative, for example, with a maximum pumping efficiency.

When the temperature of the fiber grating 52 is changed to shift the reflection band of the fiber grating 52 along the wavelength axis as shown by reference numeral 72', the center wavelength of the pump light output from the laser diode 54 is also shifted along the wavelength axis to reduce the resultant gain along the curve 70. As a result, the gain tilt becomes flat or positive. Accordingly, by suitably controlling the temperature of the fiber grating 52, the gain tilt can be maintained flat or constant.

In general, when the temperature of the fiber grating 52 rises, the grating pitch is increased and the reflection band is therefore shifted to longer wavelengths, whereas when the temperature of the fiber grating 52 falls, the grating pitch is decreased and the reflection band is therefore shifted to shorter wavelengths.

Figure 6:
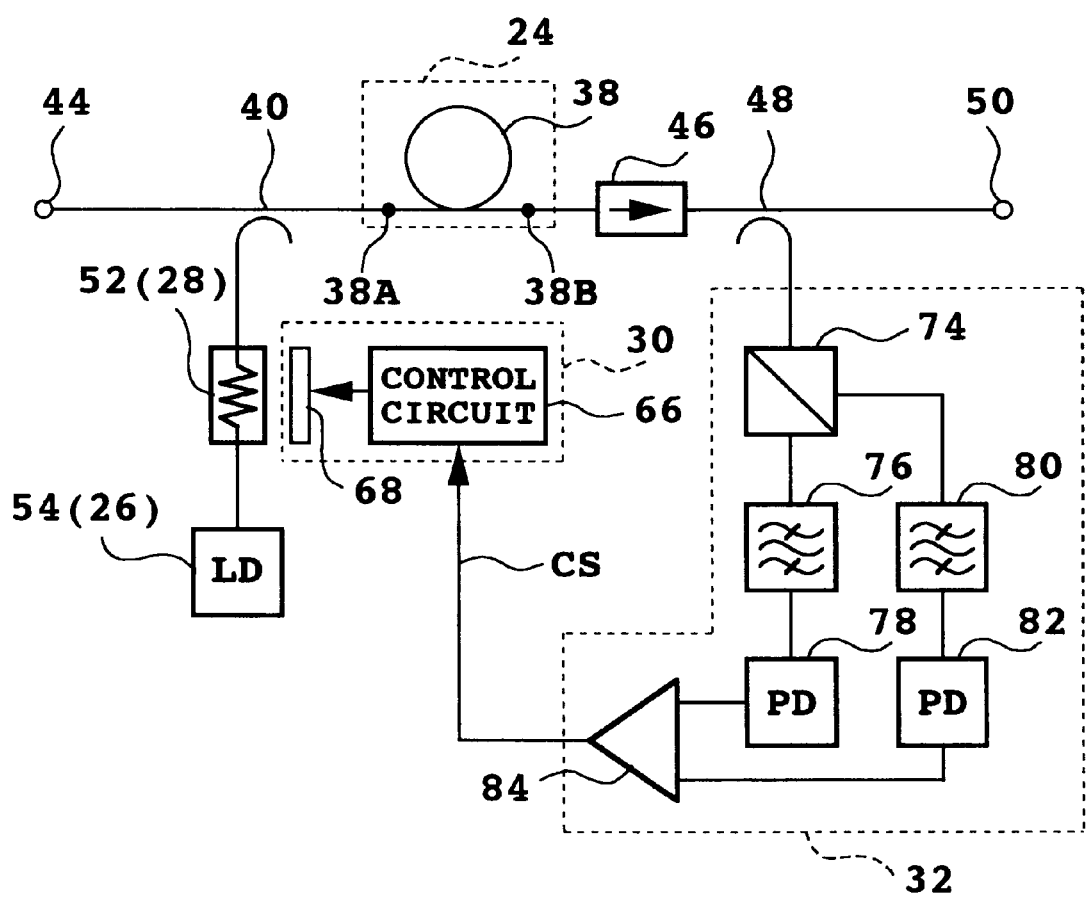
FIG. 6 is a block diagram showing a second preferred embodiment of the optical amplifier according to the present invention.

FIG. 6 is a block diagram showing a second preferred embodiment of the optical amplifier according to the present invention. In contrast with the first preferred embodiment shown in FIG. 4, the monitor unit 32 is modified and accordingly the optical coupler 42 shown in FIG. 4 is omitted, so as to directly detect a gain tilt generated in the EDF 38. The amplified signal light branched off by the optical coupler 48 is divided into first monitor light and second monitor light by a 3-dB optical coupler 74. The first monitor light is supplied through an optical bandpass filter 76 to a photodetector 78, and the second monitor light is supplied through an optical bandpass filter 80 to a photodetector 82.

The pass bands of the filters 76 and 80 will now be described with the characteristic shown in FIG. 2 taken as an example. The pass band of the filter 76 is set to a wavelength region shorter than the wavelength of the shortest-wavelength channel, and the pass band of the filter 80 is set to a wavelength region longer than the wavelength of the longest-wavelength channel. For example, the pass band of the filter 76 is set to 1545 nm ±1 nm, and the pass band of the filter 80 is set to 1560 nm ±1 nm.

The photodetector 78 outputs an electrical signal corresponding to the power of a component included in the pass band of the filter 76, and the photodetector 82 outputs an electrical signal corresponding to the power of a component included in the pass band of the filter 80. The electrical signals output from the photodetectors 78 and 82 are supplied to a comparator 84, and an output signal from the comparator 84 is supplied as a control signal CS to a control circuit 66.

With this configuration of the monitor unit 32, the gain tilt can be directly detected according to a deviation in power between the two components passed through the filters 76 and 80. Accordingly, the gain tilt can be maintained flat or constant.

Figure 7:
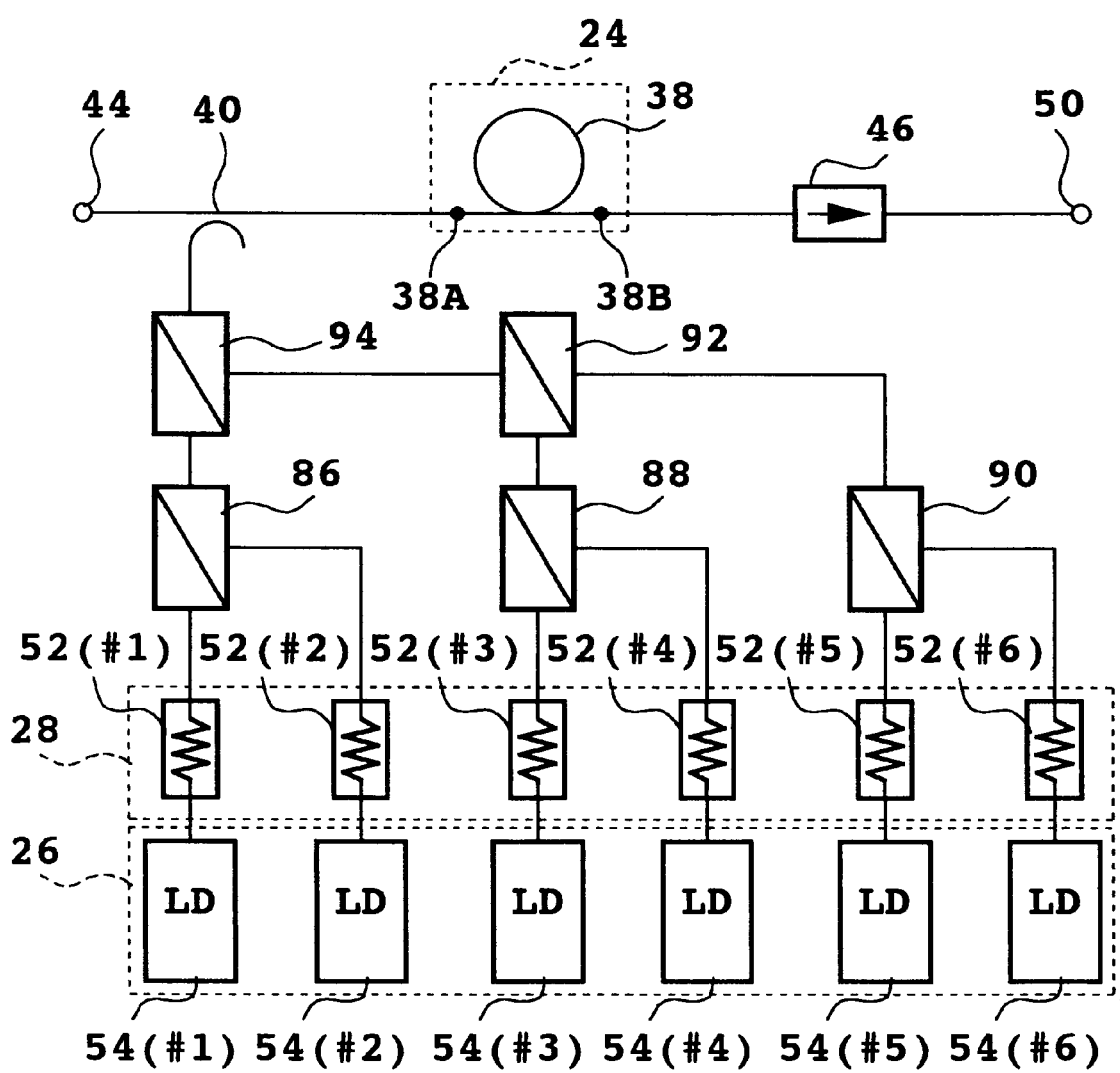
FIG. 7 is a block diagram showing a third preferred embodiment of the optical amplifier according to the present invention.

FIG. 7 is a block diagram showing a third preferred embodiment of the optical amplifier according to the present invention. In this preferred embodiment, the pumping source 26 includes a plurality of (e.g., six) laser diodes 54 (#1 to #6) to increase the power of pump light to be supplied to the EDF 38. Further, the optical filter 28 includes six fiber gratings 52 (#1 to #6) respectively optically connected to the laser diodes 54 (#1 to #6). To couple the laser diodes 54 (#1 to #6) to one optical path related with the EDF 38, three polarization beam splitters 86, 88, and 90 and two WDM couplers 92 and 94 are provided. The control unit 30 and the monitor unit 32 are not shown in FIG. 7 for clarity of illustration.

The laser diodes 54 (#1 to #6) oscillate in the same pump band, for example. In the case that the pump band is set to a 1.48 $\mu$m band, the target value of oscillation wavelengths of the laser diodes 54 (#1 and #2) is set to 1460 nm; the target value of oscillation wavelengths of the laser diodes 54 (#3 and #4) is set to 1470 nm; and the target value of oscillation wavelengths of the laser diodes 54 (#5 and #6) is set to 1480 nm. The reason for setting the target value of each oscillation wavelength as mentioned above is that the light output from each of the laser diodes 54 (#1 to #6) is a substantially linearly polarized wave, so that every two laser diodes can be coupled to one optical path by polarization combining with a polarization beam splitter.

The light output from the laser diode 54 (#1) and passed through the fiber grating 52 (#1) and the light output from the laser diode 54 (#2) and passed through the fiber grating 52 (#2) are combined by the polarization beam splitter 86. The light output from the laser diode 54 (#3) and passed through the fiber grating 52 (#3) and the light output from the laser diode 54 (#4) and passed through the fiber grating 52 (#4) are combined by the polarization beam splitter 88. The light output from the laser diode 54 (#5) and passed through the fiber grating 52 (#5) and the light output from the laser diode 54 (#6) and passed through the fiber grating 52 (#6) are combined by the polarization beam splitter 90. The light output from the polarization beam splitter 88 and the light output from the polarization beam splitter 90 are combined by the WDM coupler 92. The light output from the WDM coupler 92 and the light output from the polarization beam splitter 86 are combined by the WDM coupler 94. The light output from the WDM coupler 94 is supplied as pump light through one optical path to the WDM coupler 40, and this pump light is supplied into the EDF 38 from its first end 38A.

According to this preferred embodiment, the power of the pump light to be supplied to the EDF 38 can be sufficiently increased, so that the power of the signal light amplified in the EDF 38 can be increased, thereby increasing a transmission distance.

Figure 8:
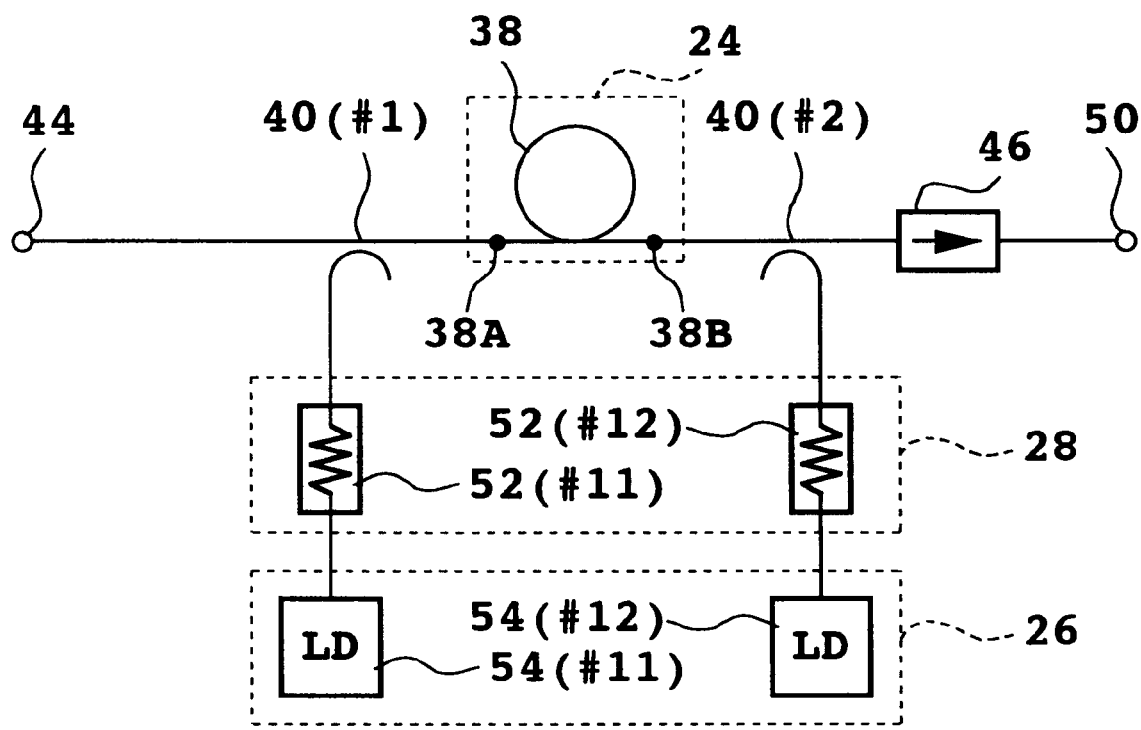
FIG. 8 is a block diagram showing a fourth preferred embodiment of the optical amplifier according to the present invention.

FIG. 8 is a block diagram showing a fourth preferred embodiment of the optical amplifier according to the present invention. The pumping source 26 is composed of a laser diode 54 (#11) for supplying first pump light to the EDF 38 from its first end 38A and a laser diode 54 (#12) for supplying second pump light to the EDF 38 from its second end 38B. The optical filter 28 is composed of fiber gratings 52 (#11 and #12) respectively optically connected to the laser diodes 54 (#11 and #12). The first pump light subjected to spectrum narrowing and wavelength locking by the fiber grating 52 (#11) is supplied through a WDM coupler 40 (#1) to the first end 38A of the EDF 38, and the second pump light subjected to spectrum narrowing and wavelength locking by the fiber grating 52 (#12) is supplied through a WDM coupler 40 (#2) to the second end 38B of the EDF 38. The control unit 30 and the monitor unit 32 are not shown in FIG. 8 for clarity of illustration.

In the case that the laser diodes 54 (#11 and #12) oscillate in the same pump band, the resonance wavelengths of the fiber gratings 52 (#11 and #12) are set different from each other for the purpose of stabilizing the power of output light from the optical amplifier. For example, in the case that the pump band of each of the laser diodes 54 (#11 and #12) is a 0.98 $\mu$m band and that the center wavelength of the first pump light is equal to or near the center wavelength of the second pump light, the power of output light from the optical amplifier becomes unstable. Accordingly, by setting a detuning wavelength between the resonance wavelengths of the fiber gratings 52 (#11 and #12) to 5 nm or greater, the same detuning wavelength can be produced between the wavelengths of the first and second pump lights, thereby stabilizing the power of output light from the optical amplifier.

According to this preferred embodiment, the power of output light from the optical amplifier can be increased because bidirectional pumping is adopted. Further, by setting the oscillation wavelength band of each of the laser diodes 54 (#11 and #12) to a 0.98 $\mu$m band, it is possible to provide an optical amplifier which can achieve low noise figure and high pumping efficiency.

Alternatively, the laser diodes 54 (#11 and #12) may be oscillated in different pump bands. For example, by oscillating the laser diode 54 (#11) in a 0.98 $\mu$m band and oscillating the laser diode 54 (#12) in a 1.48 $\mu$m band, it is possible to provide an optical amplifier which can exhibit low noise and high output light power. That is, the pumping in a 0.98 $\mu$m band is effective in obtaining low noise figure and high pumping efficiency, whereas the pumping in a 1.48 $\mu$m band is effective in increasing the power of output light from the optical amplifier. Accordingly, by setting the first pump light and the second pump light to a 0.98 $\mu$m band and a 1.48 $\mu$m band, respectively, it is possible to provide an optical amplifier which can achieve low noise and high output light power.

Figure 9:
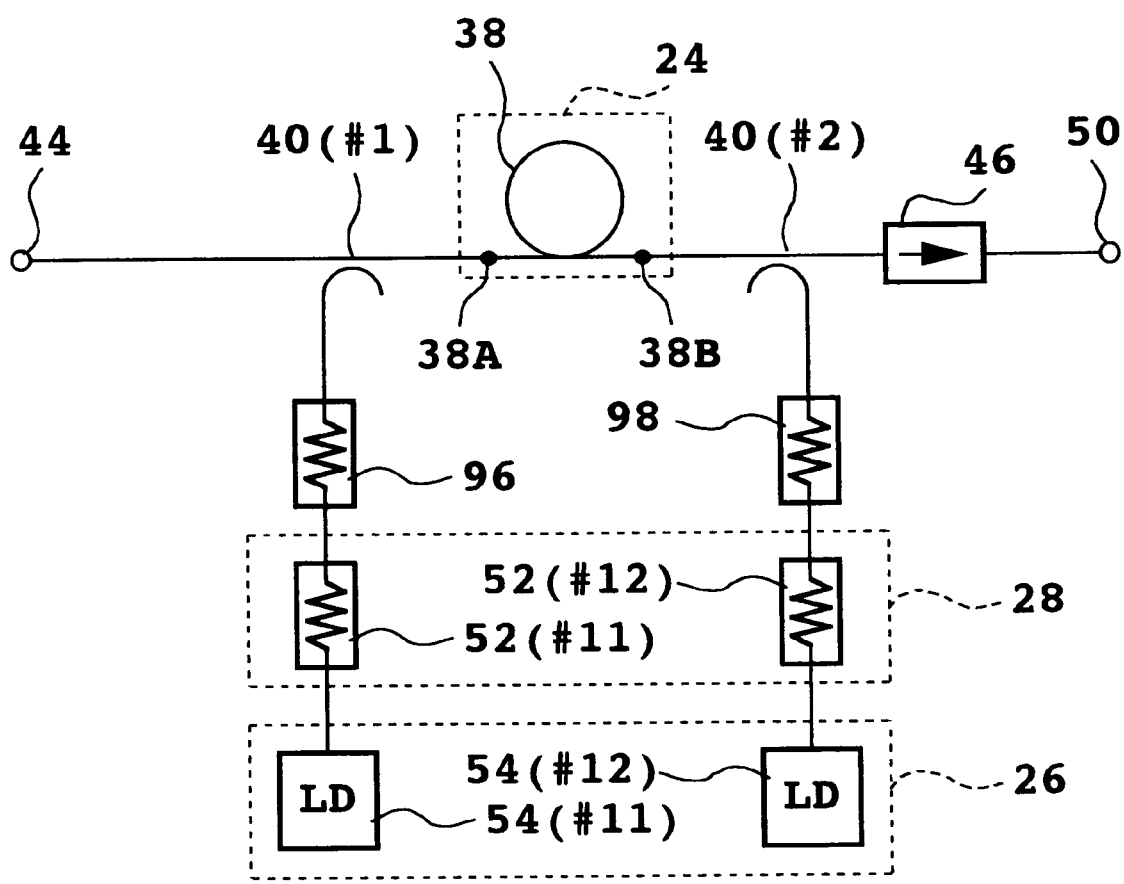
FIG. 9 is a block diagram showing a fifth preferred embodiment of the optical amplifier according to the present invention.

FIG. 9 is a block diagram showing a fifth preferred embodiment of the optical amplifier according to the present invention. This preferred embodiment is characterized in that optical filters 96 and 98 are additionally provided in the case that the laser diodes 54 (#11 and #12) in the fourth preferred embodiment shown in FIG. 8 are oscillated in different pump bands. A fiber grating may be used as each of the optical filters 96 and 98. The optical filter 96 is optically connected between the WDM coupler 40 (#1) and the fiber grating 52 (#11), and the optical filter 98 is optically connected between the WDM coupler 40 (#2) and the fiber grating 52 (#12).

The laser diode 54 (#11) is oscillated in a first pump band (e.g., 0.98 $\mu$m band), and the laser diode 54 (#12) is oscillated in a second pump band (e.g., 1.48 $\mu$m band). In this case, the optical filter 96 has a first reflection band including the second pump band and not including the first pump band, and the optical filter 98 has a second reflection band including the first pump band and not including the second pump band.

The first pump light output from the laser diode 54 (#11) and passed through the fiber grating 52 (#11) is supplied through the optical filter 96 and the WDM coupler 40 (#1) into the EDF 38 from its first end 38A, thus contributing to amplification of signal light. A residual component of the first pump light not contributing to the amplification but left in the EDF 38 is supplied from the second end 38B through the WDM coupler 40 (#2) to the optical filter 98, in which a reflection component is produced. The reflection component is then supplied back through the WDM coupler 40 (#2) into the EDF 38 from its second end 38B, thus contributing to amplification of the signal light.

The second pump light output from the laser diode 54 (#12) and passed through the fiber grating 52 (#12) is supplied through the optical filter 98 and the WDM coupler 40 (#2) into the EDF 38 from its second end 38B, thus contributing to amplification of the signal light. A residual component of the second pump light not contributing to the amplification but left in the EDF 38 is supplied from the first end 38B through the WDM coupler 40 (#1) to the optical filter 96, in which a reflection component is produced. This reflection component is then supplied back through the WDM coupler 40 (#1) into the EDF 38 from its first end 38A, thus contributing to amplification of the signal light.

According to this preferred embodiment, amplification of the signal light can be performed by effectively using the first and second pump lights, thereby providing an optical amplifier which can achieve high pumping efficiency.

In FIG. 9, the control unit 30 and the monitor unit 32 are not shown for clarity of illustration.

According to the present invention as described above, it is possible to provide an optical amplifier which can control a gain tilt and to further provide a novel system including this optical amplifier. Furthermore, it is possible to provide an optical amplifier which can maintain a gain tilt flat or constant and to further provide a novel system including this optical amplifier. Various effects obtained by the specific preferred embodiments of the present invention have been described above, so the description thereof will be omitted herein.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical amplifier comprising:

an optical amplifying medium to which signal light is supplied;

a pumping source for supplying pump light to said optical amplifying medium so that said optical amplifying medium provides a gain band including the wavelength of said signal light;

an optical filter optically connected between said optical amplifying medium and said pumping source and having wavelength selectivity depending upon temperature; and means for controlling the temperature of said optical filter according to a control signal.

2. An optical amplifier according to claim 1, further comprising:

means for detecting a gain generated in said optical amplifying medium; and means for generating said control signal so that said gain detected by said detecting means is maintained constant.

3. An optical amplifier according to claim 1, further comprising:

means for detecting a gain tilt generated in said optical amplifying medium; and means for generating said control signal so that said gain tilt detected by said detecting means becomes constant or flat.

4. An optical amplifier according to claim 1, wherein said optical filter is a fiber grating having a narrow reflection band including a resonance wavelength as a center wavelength.

5. An optical amplifier according to claim 1, wherein:

said optical amplifying medium is an erbium doped fiber having a first end and a second end;

said optical filter is connected to at least one of said first end and said second end; and said pumping source is a laser diode oscillating in at least one of a 0.98 $\mu$m band and a 1.48 $\mu$m band;

whereby said gain band includes a wavelength of 1.55 $\mu$m.

6. An optical amplifier according to claim 1, wherein:

said pumping source comprises a plurality of laser diodes;

said optical amplifier further comprising means for coupling said plurality of laser diodes to one optical path related with said optical amplifying medium.

7. An optical amplifier according to claim 1, wherein:

said optical amplifying medium is a doped fiber doped with a rare earth element and having a first end and a second end;

said pumping source comprises a first laser diode for supplying first pump light into said doped fiber from said first end, and a second laser diode for supplying second pump light into said doped fiber from said second end; and said optical filter comprises a first fiber grating optically connected between said first laser diode and said first end of said doped fiber, and a second fiber grating optically connected between said second laser diode and said second end of said doped fiber.

8. An optical amplifier according to claim 7, wherein:

said doped fiber is an erbium doped fiber;

said signal light is supplied into said erbium doped fiber from said first end; and said first and second laser diodes oscillate in a 0.98 $\mu$m band and a 1.48 $\mu$m band, respectively.

9. An optical amplifier according to claim 7, wherein:

said first laser diode oscillates in a first pump band; and said second laser diode oscillates in a second pump band different from said first pump band;

said optical amplifier further comprising:

a third fiber grating optically connected between said first laser diode and said first end of said doped fiber, said third fiber grating having a first reflection band including said second pump band and not including said first pump band; and a fourth fiber grating optically connected between said second laser diode and said second end of said doped fiber, said fourth fiber grating having a second reflection band including said first pump band and not including said second pump band.

10. An optical amplifier according to claim 7, wherein:

said first and second laser diodes oscillate in the same pump band; and said first and second fiber gratings have different resonance wavelengths.

11. An optical amplifier according to claim 10, wherein:

said doped fiber is an erbium doped fiber;

said pump band is 0.98 $\mu$m; and a detuning wavelength between said resonance wavelengths of said first and second fiber gratings is greater than 5 nm.

12. A system comprising:

an optical fiber transmission line for transmitting WDM (wavelength division multiplexed) signal light obtained by wavelength division multiplexing a plurality of optical signals having different wavelengths; and an optical amplifier optically connected to said optical fiber transmission line;

said optical amplifier comprising:

an optical amplifying medium to which said WDM signal light is supplied;

a pumping source for supplying pump light to said optical amplifying medium so that said optical amplifying medium provides a gain band including the wavelengths of said plurality of optical signals;

an optical filter optically connected between said optical amplifying medium and said pumping source and having wavelength selectivity depending upon temperature; and means for controlling the temperature of said optical filter according to a control signal.

13. A system according to claim 12, further comprising:

a first terminal station for supplying said WDM signal light to a first end of said optical fiber transmission line; and a second terminal station for receiving WDM signal light output from a second end of said optical fiber transmission line.

14. A system according to claim 12, wherein said optical amplifier is provided by each of a plurality of optical repeaters arranged along said optical fiber transmission line.

15. A system according to claim 12, further comprising:

means for detecting a gain generated in said optical amplifying medium; and means for generating said control signal so that said gain detected by said detecting means is maintained constant.

16. A system according to claim 12, further comprising:

means for detecting a gain tilt generated in said optical amplifying medium; and means for generating said control signal so that said gain tilt detected by said detecting means becomes constant or flat.

17. A system according to claim 12, wherein said optical filter is a fiber grating having a narrow reflection band including a resonance wavelength as a center wavelength.

18. A system according to claim 12, wherein:

said optical amplifying medium is an erbium doped fiber having a first end and a second end;

said optical filter is connected to at least one of said first end and said second end; and said pumping source is a laser diode oscillating in at least one of a 0.98 $\mu$m band and a 1.48 $\mu$m band;

whereby said gain band includes a wavelength of 1.55 $\mu$m.

19. A system according to claim 12, wherein:

said pumping source comprises a plurality of laser diodes;

said optical amplifier further comprising means for coupling said plurality of laser diodes to one optical path related with said optical amplifying medium.

20. A system according to claim 12, wherein:

said optical amplifying medium is a doped fiber doped with a rare earth element and having a first end and a second end;

said pumping source comprises a first laser diode for supplying first pump light into said doped fiber from said first end, and a second laser diode for supplying second pump light into said doped fiber from said second end; and said optical filter comprises a first fiber grating optically connected between said first laser diode and said first end of said doped fiber, and a second fiber grating optically connected between said second laser diode and said second end of said doped fiber.

21. A system according to claim 20, wherein:

said doped fiber is an erbium doped fiber;

said signal light is supplied into said erbium doped fiber from said first end; and said first and second laser diodes oscillate in a 0.98 $\mu$m band and a 1.48 $\mu$m band, respectively.

22. A system according to claim 20, wherein:

said first laser diode oscillates in a first pump band; and said second laser diode oscillates in a second pump band different from said first pump band;

said optical amplifier further comprising:

a third fiber grating optically connected between said first laser diode and said first end of said doped fiber, said third fiber grating having a first reflection band including said second pump band and not including said first pump band; and a fourth fiber grating optically connected between said second laser diode and said second end of said doped fiber, said fourth fiber grating having a second reflection band including said first pump band and not including said second pump band.

23. A system according to claim 20, wherein:

said first and second laser diodes oscillate in the same pump band; and said first and second fiber gratings have different resonance wavelengths.

24. A system according to claim 23, wherein:

said doped fiber is an erbium doped fiber;

said pump band is 0.98 $\mu$m; and a detuning wavelength between said resonance wavelengths of said first and second fiber gratings is greater than 5 nm.

* * * * *